(12) United States Patent
Voutsas

(10) Patent No.: US 6,169,013 B1
(45) Date of Patent: Jan. 2, 2001

(54) METHOD OF OPTIMIZING CRYSTAL GRAIN SIZE IN POLYCRYSTALLINE SILICON FILMS

(75) Inventor: Tolis Voutsas, Portland, OR (US)

(73) Assignees: Sharp Laboratories of America, Inc., Camas, WA (US); Sharp Kabushiki Kaisha, Osaka (JP)

(*) Notice: Under 35 U.S.C. 154(b), the term of this patent shall be extended for 0 days.

(21) Appl. No.: 09/248,631

(22) Filed: Feb. 11, 1999

Related U.S. Application Data (60) Continuation-in-part of application No. 09/135,393, filed on Aug. 17, 1998, now Pat. No. 5,959,314, which is a division of application No. 08/812,580, filed on Mar. 7, 1997, now Pat. No. 5,827,773.

(51) Int. Cl.[7] .............................. H01L 21/20; H01L 21/36
(52) U.S. Cl. ...................... 438/485; 438/486; 438/487; 438/488
(58) Field of Search .................................. 438/488, 150, 438/90, 96, 485, 486, 487

(56) References Cited

U.S. PATENT DOCUMENTS

| | | | |
|---|---|---|---|
| 4,986,213 | 1/1991 | Yamazaki et al. | 118/719 |
| 5,171,710 | 12/1992 | Yamazaki et al. | 437/174 |
| 5,296,405 | 3/1994 | Yamazaki et al. | 437/174 |
| 5,313,076 | 5/1994 | Yamazaki et al. | 257/66 |
| 5,424,230 | 6/1995 | Wakai | 437/40 |
| 5,624,873 | 4/1997 | Fonash et al. | 438/487 |
| 5,686,349 | 11/1997 | Nakata | 437/101 |
| 5,753,542 | 5/1998 | Yamazaki et al. | 438/162 |
| 5,796,116 | 8/1998 | Nakata et al. | 257/66 |
| 5,827,773 | * 10/1998 | Voustas | 438/488 |
| 5,834,071 | 11/1998 | Lin | 427/578 |
| 5,834,345 | 11/1998 | Shimizu | 438/158 |
| 5,834,796 | 11/1998 | Matsuda et al. | 257/57 |
| 5,897,331 | * 4/1999 | Sopori | 438/90 |
| 5,904,770 | * 5/1999 | Ohtani et al. | 438/485 |

FOREIGN PATENT DOCUMENTS 9-36376  7/1995  (JP).

OTHER PUBLICATIONS

Article entitled "Deposition of Precursor Poly–Silicon Films for Flat Panel Display Applications" vby R. Pethe, C. Deshpandey, S. Dixit, E. Demaray, D. Meakin, D. Orgill, N. Turner published in Mat. Res. Soc. Symp. Proc. vol. 471, 1997, pp. 3–7, Month Unknown.

* cited by examiner

*Primary Examiner*—Richard Elms
*Assistant Examiner*—Michael S. Lebentritt
(74) *Attorney, Agent, or Firm*—David C. Ripma; Matthew D. Rabdau (57) ABSTRACT

A method is provided for optimizing the crystal drain size in polycrystalline silicon films deposited on transparent substrates suitable for the manufacture of liquid crystal displays. A film of microcrystalline silicon is deposited on a transparent substrate in a manner which yields microcrystallites embedded in the film during deposit. By means of excimer laser anneal, or another suitable annealing method, the microcrystalline silicon film is partially melted to leave a portion of the microcrystallites unmelted upon completion of the anneal. The film is then allowed to crystallize by crystal growth from the microcrystallites that remain unmelted in the film. The result is high quality polycrystalline silicon having large grain sizes suitable for active devices, such as TFTs.

20 Claims, 7 Drawing Sheets

METHOD OF OPTIMIZING CRYSTAL GRAIN SIZE IN POLYCRYSTALLINE SILICON FILMS

This application is a continuation-in-part of application Ser. No. 09/135,393, filed Aug. 17, 1998, entitled "Polycrystalline Silicon from the Crystallization of Microcrystalline Silicon," invented by Tolis Voutsas now issued as U.S. Letters Patent No. 5,959,314, which is a divisional of application Ser. No. 08/812,580, filed Mar. 7, 1997, entitled "Method for Forming Polycrystalline Silicon From the Crystallization of Microcrystalline Silicon," invented by Tolis Voutsas, now issued as U.S. Letters Patent No. 5,827,773.

BACKGROUND AND SUMMARY OF THE INVENTION

This invention relates generally to thin film transistor (TFT) processes and fabrication, and more particularly, to a polycrystalline film, and method of forming the polycrystalline film, from a microcrystalline film.

The demand for smaller electronic consumer products with higher resolution displays, spurs continued research and development in the area of liquid crystal displays (LCDs). The size of LCDs can be decreased, and the performance enhanced, by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin film transistor (TFT). TFTs are typically mounted on a transparent substrate such as quartz or glass. TFT performance is improved by increasing the electron mobility in the devices. Increased electron mobility results in brighter LCD screens, lower power consumption, and faster transistor response times. Many of these performance enhancement features are due to the improved switching characteristics associated with TFTs. In addition, further LCD enhancements require uniform TFT performance. That is, display and driver transistors across the entire display must operate at substantially the same level of performance.

The carrier mobility of transistors formed from amorphous silicon is poor, insufficient for LCD circuit driver circuits. The carrier mobility of transistors is improved by using crystallized silicon. Uniformity in transistor performance requires that the crystalline film, from which the TFTs are formed, include areas of substantially uniform crystalline structure. Ideally, the crystalline film from which the TFT semiconductors are made would be crystallized in one uniform crystallographic pattern. But, single crystal silicon films, for use on LCDs are difficult to fabricate when adhered to relatively fragile transparent substrates.

A workable compromise between single crystal films, and amorphous silicon are polycrystalline silicon films, also referred to herein as polycrystalline films. Typically, polycrystalline films include multiple areas of crystallization that are adjacent, but of different crystallographic orientations. That is, the film is composed of many different crystallized areas with somewhat random shapes and random crystallographic orientations. Improved performance across a polycrystalline film is enhanced by making larger areas of uniform crystallization. The average size of the areas of uniform-grain crystallization in a polycrystalline film is referred to in the art as the grain size or average grain size of the film.

Large areas of uniform crystallization inside the polycrystalline film (i.e., large grain size) improves the uniformity of the performance of the film. In addition, the performance of transistors manufactured from the polycrystalline film can be enhanced by decreasing the number of grain boundaries, or areas of intersecting between different crystal grains. The boundary areas between crystal grains form electron traps which reduce electron mobility in TFTs. As a result, the device stability is decreased as the threshold voltages and leakage currents of such devices are increased.

One problem in making polycrystalline film with large grains, and therefore improved TFTs, is that conventional silicon deposition methods used on glass yield only amorphous material. Another problem is the relatively low temperatures that the glass and quartz substrates are able to withstand before degrading. Typically, the transparent substrate is covered with a film of amorphous matter such as silicon or a silicon-germanium compound. The amorphous matter is heated, or annealed, so that the amorphous material takes on a crystalline form. Typically, the annealing process is limited by the requirement that the amorphous material not be heated above a temperature of approximately 600° C. Above that temperature the transparent substrates are often damaged.

Various annealing methods exist for turning amorphous silicon into polycrystalline silicon. Solid phase crystallization (SPC) is a popular method of crystallizing silicon in a furnace. In this process, amorphous silicon is exposed to heat approaching 600° C. for a period of at least several hours. The heat is typically generated from a resistive heater heat source, although SPC can also be induced by other annealing methods well known to those skilled in the art, some of the annealing methods being described below. A rapid thermal anneal (RTA) heats the film to a higher temperature than non-RTA furnace annealing, but for very short durations of time. The amorphous film and transparent substrate are mounted on a relatively low temperature heated surface, or susceptor. The silicon is rapidly heated to a temperature in the range between 700° C. and 800° C.; the substrate heats more slowly which avoids degrading the transparent substrates upon which the film is mounted. One method of performing this anneal is using the IR rays of a heat lamp, such as a halogen heat lamp. Annealing a silicon film with a heat lamp is alternatively referred to herein as lamp anneal or lamp annealing.

An excimer laser process (ELC), such as, for example, excimer laser anneal (ELA) or laser anneal, has also been used with some success in annealing amorphous silicon. Excimer laser energy or laser energy directed at the silicon film allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformity's into the annealing process.

For convenience herein the terms excimer laser process, excimer laser anneal (ELA), and laser anneal will be used interchangeably to mean heating by means of laser energy. It should be understood that when reference is made to ELA or excimer laser anneal or processes the laser used need not be limited to pulsed or intermittent operation and that the present invention described herein can employ continuous laser energy in every step where ELA or other laser processes are specified.

The physical processes which take place when amorphous silicon is annealed to form crystallized silicon is not entirely understood, and research on the subject continues. Variations such as temperature, film thickness, the degree to which the amorphous matter melts, impurities in the film, and a range of other factors influence the annealing of amorphous silicon. Generally, the largest grains of crystallization occur in a polycrystalline film at a specific temperature near the melting point. Temperatures below this preferred temperature do not melt the amorphous silicon enough to form large grain areas. Temperatures above the preferred temperature rapidly lead to bulk nucleation. The bulk nucleation of amorphous matter results in relatively small grain sizes and poor quality polycrystalline silicon.

The method of depositing amorphous silicon on the transparent substrate is also crucial in the fabrication of polycrystalline films having large crystal grains. Chemical vapor deposition (CVD) processes are available for depositing silicon on a transparent substrate. In a suitable CVD chamber the substrate is mounted on a heated susceptor. The transparent substrate is exposed to gases which include elements of silicon and hydrogen. The gases decompose to leave solid phase silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources are used. In a hot wire CVD system the production of activated hydrogen atoms leads to the decomposition of the source gases.

It would be advantageous if the grains of annealed polycrystalline film could be made larger, preferably in the range of 150–700 nm or more, to improve the carrier mobility and the quality of the film.

It would be advantageous if the grain sizes in a polycrystalline film could be made uniform so as to minimize the difference between grains in the film, and therefore, minimize differences between active devices in different grain areas.

It would also be advantageous, in as-deposited silicon film on a transparent substrate which is crystallized to form polycrystalline silicon film, if the average grain size of the polycrystalline silicon film could be optimized (i.e., made as large as possible) for any given unit value of heat energy used in annealing the as-deposited film.

Accordingly, a method is provided of optimizing crystal grain size in polycrystalline silicon films formed by the crystallization of as-deposited silicon. The method comprises the steps of depositing a microcrystalline silicon film on a substrate. The deposited silicon film is then partially melted to leave unmelted a portion of the microcrystallites in the film. And the silicon film is then allowed to crystallize by crystal growth from the unmelted microcrystallites in the silicon. The result is a polycrystalline silicon film having optimal average grain size, preferably exceeding 500 nm in equivalent radius and, more preferably, exceeding 1 micron.

The preferred technique for carrying out the step of partially melting the silicon film is excimer laser anneal (ELA) which, as the term is used herein, also encompasses laser anneal or continuous laser anneal or other non-pulsed laser annealing processes. An alternative means for partially melting the silicon film, within the scope of the present invention, is lamp anneal or RTA using infrared radiation.

In its preferred embodiment, the step of depositing a microcrystalline silicon film on a substrate, the substrate preferably being glass or another transparent substrate, the microcrystalline silicon film is preferably deposited to include within the film microcrystallites with an average size generally in the range of 5Å to 500Å. More preferably, the average size of the microcrystallites in the deposited silicon film exceeds 10Å. In addition, the microcrystalline silicon film is preferably deposited with a crystalline fraction in the film which is generally in the range of 0.01% to 80%. And it is considered more advantageous to deposit microcrystalline silicon film in which the crystalline fraction in the film as deposited is generally in the range of 5% to 65%. Deposition of the microcrystalline silicon film with the above-noted characteristics is preferably carried out by means of plasma enhanced chemical vapor deposition (PECVD) at a deposition rate of less than 10Å per second. Since it appears that the size of the microcrystallites in the deposited silicon film increases as the rate of deposition decreases, it is preferred that the deposition of silicon on the substrate by PECVD be carried out at a deposition rate of less than 7Å per second, and more preferably at less than 3Å per second, to achieve the largest microcrystallites in the film.

As noted above, a preferred technique for carrying out the step of partially melting the silicon film is excimer laser anneal (ELA). It is generally preferred that ELA be carried out, on deposited films generally between 200Å and 1000Å thick, at an energy density falling generally in the range of 190 mJ/cm$^2$ to 500 mJ/cm$^2$. In order to optimize the partial melting of the silicon film, thereby leaving unmelted a portion of the microcrystallites in the film, the energy density directed at the film during ELA is related to the overall thickness of the deposited film in accordance with the following equation:

DETAILED DESCRIPTION OF THE PREFERRED EMBODIMENT

FIGS. 1–4 illustrate steps in a method of forming an LCD 10. Ultimately, LCD 10 of FIG. 1 comprises a transparent substrate 12, and a polycrystalline semiconductor film (see FIG. 4) overlying substrate 12. Typically, substrate 12 is selected from the group consisting of quartz, glass, and plastic. The polycrystalline film is formed from depositing a microcrystalline film 14 on substrate 12. Microcrystalline film 14 includes amorphous matter 15 embedded with microcrystallites, or small seed crystals, 16. Microcrystalline film 14 has a thickness 17, also referred to herein as the first thickness. Typically, a barrier layer separates substrate 12 from film 14, it is not shown for the sake of clarity. In the process of making LCD 10, TFT devices (not shown) are formed from film 14.

Figure 2:
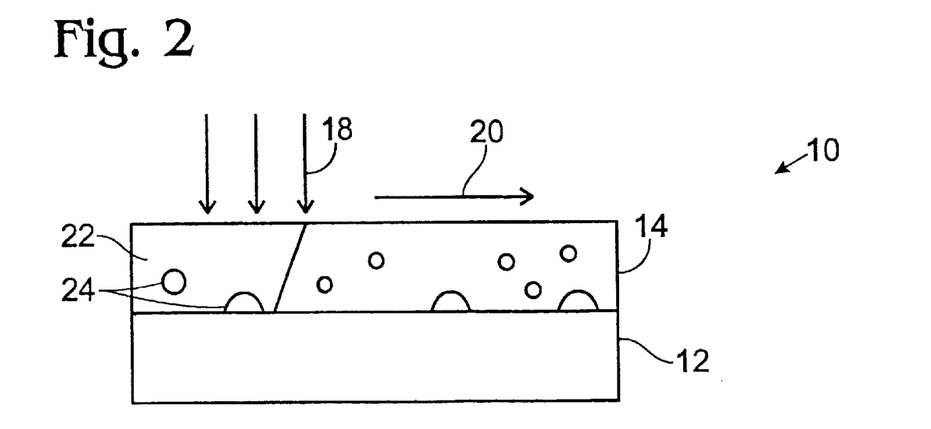
Figure 4:
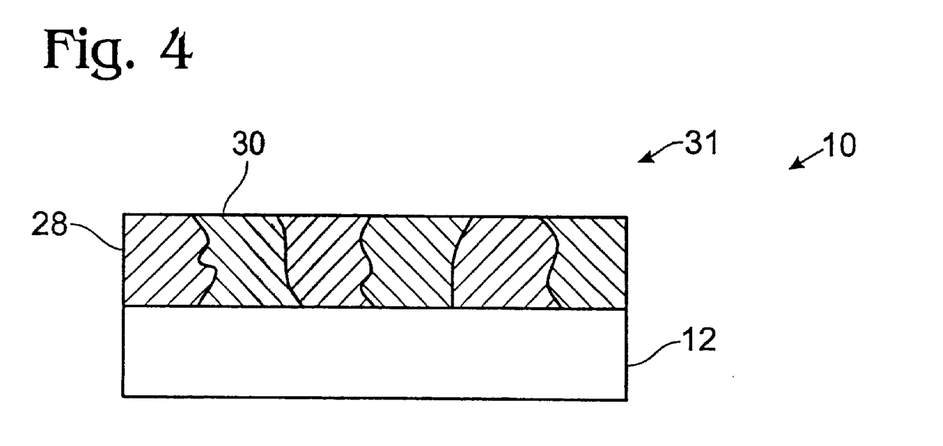

FIG. 2 illustrates the annealing of microcrystalline film 14 to create the polycrystalline TFT film shown in FIG. 4. A series of arrows 18 pointing perpendicular to the surface of film 14 represent light from a excimer laser, not shown. Due to the limited aperture size of the laser, it is typical to reposition laser beams 18 across film surface 14 during annealment. The laser is energized briefly and emits an energy pulse over a limited area which is expressed herein in units of milli-joules per square centimeter (mJ/cm$^2$), as is well known in the art. The direction of sweep of laser beam 18 is represented by arrow 20 pointing parallel to film 14. In other words, as depicted in FIG. 2, a burst of laser energy 18 is directed at a portion of film 14 and then the beam is moved to the right (as viewed in FIG. 2) and another burst of laser energy is directed at the film. Usually there is substantial overlap between adjacent bursts of laser energy to ensure coverage. The energy density values given herein (in mJ/cm$^2$) are for the total excimer laser energy directed at the surface of the film during ELA. Arrows 18 alternatively depict IR energy directed at film 14 if lamp anneal is used during the step of partially melting the deposited silicon film in accordance with the present invention. In the case of lamp anneal (not shown), the arrows would be directed over the entire surface of film 14 (and arrow 20 omitted), as will be understood by those skilled in the art.

Returning to the example of ELA shown in FIG. 2, a portion of film 14, with the reference designator 22, is shown melted by laser beam 18. It is typical for a number of the microcrystallites in melted area 22 to also melt during annealment. Remaining microcrystallites 24 are the seed crystal that cause melted area 22 to form crystal grains, when the silicon film is allowed to crystallize, following ELA or other annealing process. The crystal grains form by crystal growth from the unmelted microcrystallites 24 in the silicon. It is an aspect of the invention that microcrystalline film 14 is heated to selectively melt amorphous matter 22, leaving a portion of the original microcrystallites 24 unmelted. A controlled number of unmelted seed crystals 24 (following the partial melting anneal step) promotes crystal grains of a large average size in the resultant polycrystalline silicon film.

Figure 1:
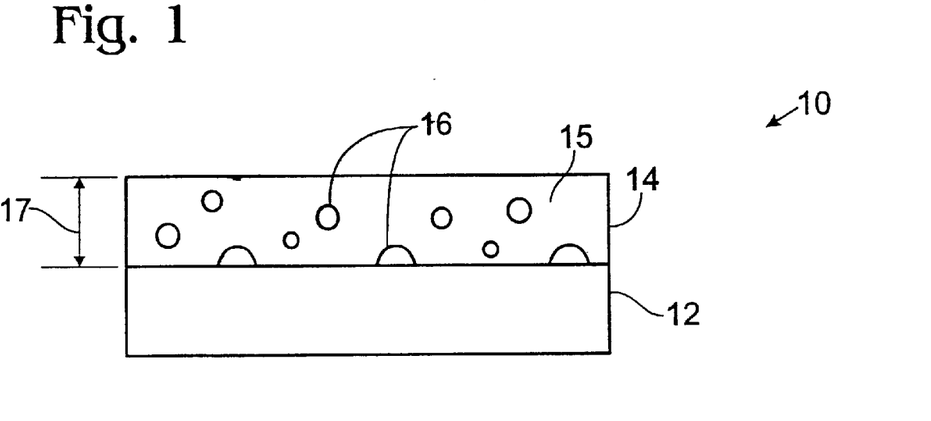
FIGS. 1–4 illustrate steps in a method of forming an LCD.
Figure 3:
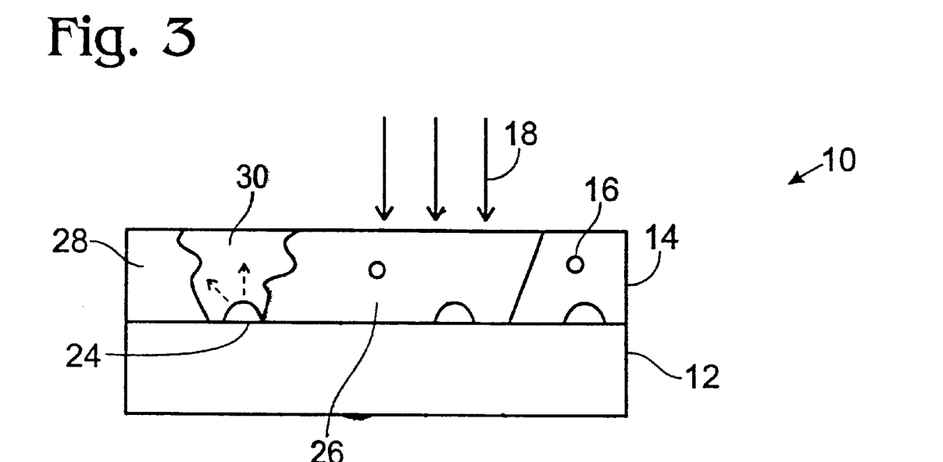

FIG. 3 is a view of LCD 10 in FIG. 1 further in the ELA annealment process begun in FIG. 2. Laser beam 18 has moved from its position shown in FIG. 2 melting a new area 26. Film area 22 (beneath excimer laser beam 18 in FIG. 2) has cooled so that a crystal grain 28 is formed around a seed crystal (not shown) and film area 30 is crystallizing by growth outward from microcrystallite 24 to form a grain around the microcrystallite.

FIG. 4 is a view of LCD 10 after annealment. A TFT polycrystalline semiconductor film 31 now overlies transparent substrate 12. Film 31 is composed of areas of large crystal grains, includes grains 28 and 30. The inclusion of embedded seed crystals 16 in amorphous matter 15 (see FIG. 1) encourages substantially uniform grain crystals 28–30 having a relatively large size.

Figure 5:
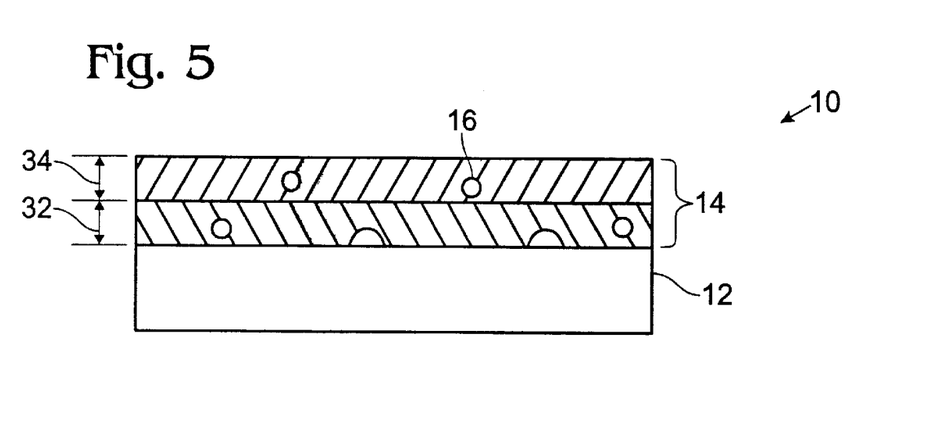
FIG. 5 is a view of the LCD of FIG. 1 wherein the deposited microcrystalline film includes two thicknesses.

FIG. 5 is a view of LCD 10 of FIG. 1 wherein deposited microcrystalline film 14 includes two thicknesses. Film 14 includes a predetermined first thickness 32, and a predetermined second thickness 34 overlying first thickness 32. The annealing of microcrystalline film 14 includes melting second thickness of film 34. The selective melting of film 14 is accomplished through varying the overall thickness of film 14, the energy in laser beam 18, the duration of exposure to laser beam 18, and the number of repetitions of exposure to laser beam 18. By controlling the thicknesses of first thickness 32, and second thickness 34, the number of seed crystals 16 in first thickness 32 is regulated. A controlled number of seed crystal 16 in first film thickness 32 promotes crystal grains of a uniformly large size.

Figure 6:
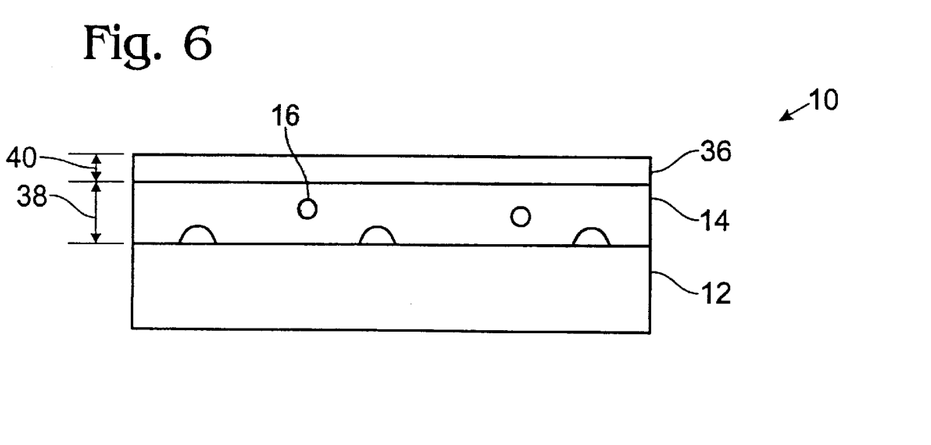
FIG. 6 is a view of the LCD of FIG. 1, further comprising a second, completely amorphous matter, film overlying the microcrystalline film.

FIG. 6 is a partial cross-sectional view of LCD 10 of FIG. 1, further comprising a second, completely amorphous matter, film 36 overlying microcrystalline film 14. Since there are fewer complications in depositing completely amorphous film 36, the film deposition process is speeded with the use of completely amorphous film 36. That is, the deposition process is faster because completely amorphous matter film 36 is easier to deposit. The annealing process includes extending crystalline regions from microcrystalline film 14 into second film 36 so that the advantages of using microcrystalline film 14 are utilized. Microcrystalline film 14 has a predetermined first thickness 38, and second film 36 has a predetermined second thickness 40. Second thickness 40 is generally less than approximately 25% of the combined first 38 and second 40 thicknesses. Research is presently continuing to increase second thickness 40 relative to first thickness 38 so as to further quicken the deposition process.

Referring again to FIGS. 1–4, the distribution and the size of the crystal grains resulting after the annealment process is regulated in response to the number of seed crystals 16 in microcrystalline film 14. The present invention was developed in response to uncertainties in the deposition of amorphous film on transparent substrates, and in response to the lack of uniformity in the annealment process, especially when an excimer laser is used. Because the excimer laser allows more selective heating of the silicon film, more options in the annealment process are provided. However, the high energies, short durations, and small apertures of the excimer laser beam also result in non-uniformity's in the annealment process. The presence of microcrystallites 16 to regulate the annealment process reduces dependence on the chemical composition of microcrystalline film 14, the thickness of film 14, and inconsistencies in the heating and annealment process.

Figure 7:
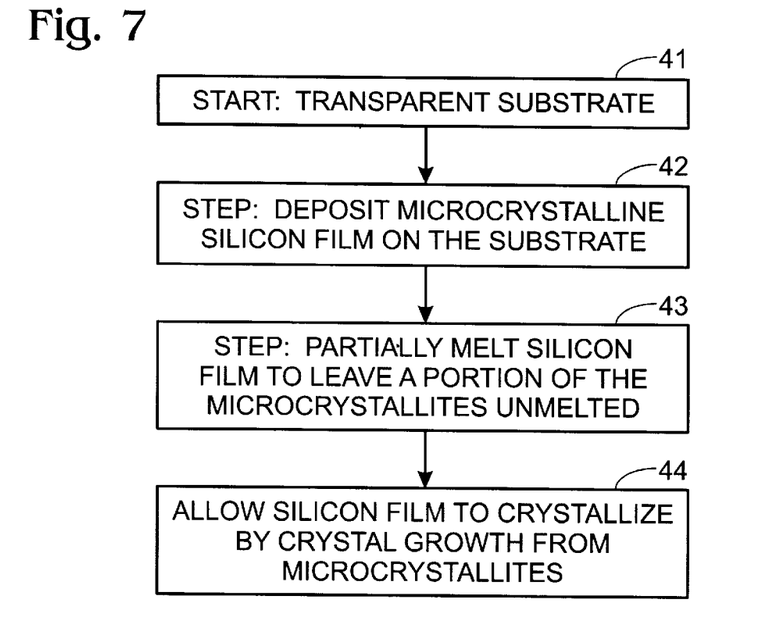
FIG. 7 is a flow diagram illustrating steps in the method in forming polycrystalline film from a microcrystalline film.

FIG. 7. shows the steps in the method of the present invention. The starting substrate 41 is preferably glass or another transparent material suitable for use in liquid crystal displays (LCDs). The next step 42 is depositing a microcrystalline silicon film on the substrate. This is carried out by any suitable deposition method for depositing on a substrate silicon which contains microcrystallites. A preferred method for depositing the silicon film is plasma enhanced chemical vapor deposition (PECVD). The next step 43 is to partially melt the silicon film to leave unmelted a portion of the microcrystallites in the film. The preferred method of melting the silicon film in accordance with this step is to use excimer laser anneal (ELA) or laser anneal (continuous laser, not pulsed), and an alternative method is lamp anneal. The partial melt allows the product of the method, which is the polycrystalline silicon film ultimately formed in step 44, to form. Upon conclusion of the anneal (or partial melt) the silicon film is allowed to crystallize by crystal growth from the remaining unmelted microcrystallites. The presence of the microcrystallites ensures that, for any given energy density used during the anneal, the average size of the crystal grains in the polycrystalline silicon film is optimized, meaning they are as large as possible.

As the term is used herein, the average size of crystal grains in both the pre-melt deposited microcrystalline silicon and the final polycrystalline silicon is determined as follows. An equivalent or average grain size is defined to be based on the measured major and minor axes of a crystal, which is irregular in shape. The equivalent grain size (or simply "size") is given by the geometric mean of the major and minor axes as:

$$r = \sqrt{(a \cdot b)} \quad (1)$$

where r is the grain size (or "average grain size" or "equivalent grain size" or "size") of a crystal grain, and where a is the major axis (dimension) of the grain, and b is the minor axis (dimension) of the grain.

The annealment process is also regulated with respect to the size of microcrystallites 16. Still referring to FIG. 1, microcrystalline film 14 is embedded with microcrystallites 16 having a size generally in the range between 5Å and 500Å. The control over the size and stability of crystalline clusters is responsive to the size of seed crystal 16.

It is an aspect of the invention that amorphous matter 15 and microcrystallites 16 are silicon. Alternatively, the amorphous matter 15 and microcrystallites 16 could be a silicon-germanium compound.

It is an aspect of the invention that microcrystallites 16, embedded in microcrystalline film 14, have a substantially predetermined first crystallographic orientation. Referring to FIG. 4, polycrystalline film 31 has the first crystallographic orientation of microcrystallites 16 in FIG. 1. The use of a common crystallographic orientation throughout polycrystalline film 31 minimizes grain boundaries. Preferably, the first crystallographic orientation of embedded microcrystallites 16 is (110) or (111). In the above-described process, the crystallographic orientation of microcrystallite 16 is determined before microcrystallites 16 are embedded in film 14. A preferred crystallographic orientation, or texture, is developed by appropriate selection of film deposition conditions. The preferred texture of the deposited microcrystallites is transferred to the crystal grains formed after the annealing process.

In another aspect of the invention, microcrystallites 16 have a random crystallographic orientation when they are embedded in microcrystalline film 14, before annealment. Microcrystalline film 14 is selectively heated to annihilate microcrystallites 16 not having a predetermined first crystallographic orientation. Microcrystalline film 14 is annealed to have substantially a first crystallographic orientation of the surviving microcrystallite 16. Referring to FIG. 4, a common crystallographic orientation throughout polycrystalline film 31 minimizes grain boundaries. That is, the heat in the annealment process is selected to melt all crystallites 16 except crystallites 16 having the first crystallographic orientation. Microcrystallites 16, having the first crystallographic orientation, survive the annealment process because they melt at a higher temperature than microcrystallites 16 of other crystallographic orientations. Preferably, the first crystallographic orientation of embedded microcrystallites 16 is (110) or (111).

Referring again to FIG. 2, it is an aspect of the invention that film 14, when annealed with an excimer laser (ELA) in step 43, uses light 18 having a wave length of approximately 308 nanometers (nm), or less. As noted above, the use of excimer laser anneal includes, within the meaning of the invention described herein, the use of laser anneal, whether excimer or not. Further, microcrystalline film 14 is annealed at a temperature which is approximately the melting point of amorphous silicon 15 for a duration of approximately 50 nanoseconds (ns). Assuming the microcrystalline film 14 is silicon, microcrystalline film 14 is annealed using an excimer laser at a temperature generally in the range between 900° C. and 1600° C. If alternatively the microcrystalline film 14 is silicon-germanium, microcrystalline film 14 is annealed at a temperature generally in the range greater than 800° C.

Alternately, microcrystalline film 14 is annealed with a furnace anneal process, not shown, at a temperature below approximately 600° C. for a duration generally in the range between 3 hours and 3 days. It is another aspect of the invention that microcrystalline film 14 is annealed with a rapid thermal anneal (RTA) crystallization process, not shown, at a temperature below approximately 900° C. for a duration generally in the range between 1 and 5 seconds.

Referring again to FIG. 1, it is an aspect of the invention that microcrystalline film 14 has a thickness 17 of less than approximately 1000 Å. Referring again to FIG. 4, a polycrystalline film 31 of this thickness is suitable for the manufacture of thin film transistors. Preferably, microcrystalline film 14 has a thickness of less than approximately 500Å. Polycrystalline film 31 is well suited for the manufacture of thin film transistors with this smaller thickness. In a laser anneal process, the crystal grains of thinner films tend to be larger than in thicker films. These thicker grains are observed in films having a thickness in the range between 20 and 50 nanometers (nm).

It is an aspect of the invention that microcrystalline film 14 is deposited by a plasma enhanced chemical vapor deposition (PECVD) process using a $SiH_4$ and $H_2$ gas mixture. Microcrystalline film 14 is deposited at a power level of approximately 600 watts, at a temperature of approximately 320° C., a total pressure of approximately 1.2 Torr, a $SiH_4$ flow rate of 20 sccm, and a $H_2$ flow rate of 2000 sccm.

Alternately microcrystalline film 14 is deposited through a process selected from the group consisting of low pressure chemical vapor deposition (LPCVD), ultra-high vacuum CVD, photochemical CVD, high-density plasma CVD, hot-wire CVD, and sputtering.

Microcrystalline film 14 is deposited through chemistries selected from the group consisting of disilane ($Si_2H_6$, higher silanes represented by the formula $Si_NH_{2N+2}$, where N is greater than 2, and combinations of silane/fluorosilane chemistries represented by the structural formula $Si_NH_{2N+2}/Si_NF_{2N+2}$, where N is greater than, or equal to, 1.

It is an aspect of the invention that microcrystalline film 14 is deposited in an ultra-high vacuum environment, whereby the minimization of contaminates enhances the formation of microcrystallite 16. In the presence of contaminants there is a competition for absorption on the surface of the substrate between silicon species and impurities. As a result, the surface mobility of absorbed silicon species is reduced and there is a smaller probability of forming crystalline clusters than in an environment devoid of gaseous impurities. Further, transparent substrate 12 is cleaned before microcrystalline film 14 is deposited, whereby the formation of microcrystallite 16 in microcrystalline film 14 is promoted. Cleaning is accomplished with an in-situ plasma clean using Ar, $O_2$, $N_2$, or $H_2$, or by ex-situ wet cleaning chemistries, or mechanical means (i.e., bead blasting).

It is another aspect of the invention that Step 43 includes heating the microcrystalline film deposited in Step 42 to selectively melt the amorphous matter, leaving a predetermined or residual number of microcrystallites in the amorphous matter unmelted. In this manner, the unmelted seed crystals promote crystal grains of a uniformly large size.

A preferred embodiment of the invention includes a further step, following Step 42, of depositing a second, completely amorphous matter, film overlying the microcrystalline film deposited in Step 42. The annealing in Step 43 includes extending crystalline regions from the microcrystalline film into the second film. The film deposition process is speeded with the use of a completely amorphous film. The microcrystalline film has a predetermined first thickness and the second film has a predetermined second thickness, and the second thickness is generally less than approximately 25% of the combined first and second thicknesses. This process is also depicted in FIG. 5.

The distribution and size of crystal grains formed in step 44 (FIG. 7) is regulated to the number of seed crystals and microcrystalline film. Step 42 also includes depositing a film including amorphous matter embedded with microcrystallites having a size generally in the range between 50Å and 500Å. Control over the size and stability of crystalline clusters is responsive to the size of the seed crystals.

In one preferred embodiment, the amorphous matter and microcrystallites of the form deposited in Step 42 are silicon. Alternately, the amorphous matter and microcrystallites of the film deposited in Step 42 are a silicon-germanium compound.

It is an aspect of the invention that step 42 includes depositing a film in which the microcrystallites, embedded in the amorphous matter, have a uniform distribution pattern. The number of crystal grain boundaries is thereby minimized.

In one preferred embodiment of the invention, Step 42 includes depositing a microcrystalline film embedded with microcrystallites having a substantially predetermined first crystallographic orientation. Step 43 includes annealing the polycrystalline film to have the first crystallographic orientation of the microcrystallites deposited in Step 42. The use of a common crystallographic orientation throughout the polycrystalline film minimizes grain boundaries. Preferably, the first crystallographic orientation of the embedded microcrystallites is (110) or (111).

In another preferred embodiment, Step 43 includes heating the microcrystalline film deposited in Step 42 to selectively annihilate microcrystallites not having a predetermined first crystallographic orientation, and annealing the microcrystalline film to have substantially the first crystallographic orientation of the surviving microcrystallites. A common crystallographic orientation throughout the polycrystalline film minimizes grain boundaries. Preferably, the first crystallographic orientation of the embedded microcrystallites is (110) or (111).

It is an aspect of the invention that Step 43 includes annealing with an excimer laser crystallization (ELC) process, in which the film deposited in Step 42 is heated with a light having a wavelength of approximately 308 nm, or less. Further, Step 43 includes annealing the microcrystalline film deposited in Step 42 at a temperature of approximately the melting point of the amorphous matter for a duration of approximately 50 ns. When the microcrystalline film deposited in Step 42 is silicon, Step 43 includes annealing the microcrystalline film at a temperature generally in the range between 900° C. and 1600° C. When the microcrystalline film deposited in Step 42 is silicon-germanium, Step 43 includes annealing the microcrystalline film at a temperature generally greater than 800° C.

Alternately, Step 43 includes annealing with a furnace anneal process, in which the microcrystalline film deposited in Step 42 is heated at a temperature below approximately 600° C. for a duration generally in the range between 3 hours and 3 days. In another alternative aspect of the invention, Step 43 includes annealing with a rapid thermal anneal (RTA) crystallization process, in which the microcrystalline film deposited in Step 42 is heated at a temperature below approximately 900° C. for a duration generally in the range between 1 and 5 seconds.

It is an aspect of the invention that Step 42 includes depositing microcrystalline film having a thickness of less than approximately 1000Å, whereby the polycrystalline film is suitable for the manufacture of thin film transistors. Preferably Step 42 includes depositing microcrystalline film having a thickness of less than approximately 500Å, whereby the polycrystaihne film is well suited to the manufacture of thin film transistors.

It is an aspect of the invention that Step 42 includes depositing the microcrystalline film by a PECVD process, using a $SiH_4$ and $H_2$ gas mixture. The microcrystalline film is deposited in Step 42 at a power level of approximately 600 watts, at a temperature of approximately 320° C., at a total pressure of approximately 1.2 Torr, a $SiH_4$ flow rate of 20 sccm, and $H_2$ flow rate of 2000 sccm.

Alternately, the microcrystalline film is deposited in Step 42 through a process selected from the group consisting of LPCVD, ultra-high vacuum CVD, photochemical CVD, high-density plasma CVD, hot-wire CVD, and sputtering.

It is an aspect of the invention that the microcrystalline film is deposited in Step 42 through chemistries selected from the group consisting of disilane ($Si_2H_6$), higher silanes represented by the formula $Si_NH_{2N+2}$, where N is greater than 2, and combinations of silaneifluorosilane chemistries represented by the structural formula $Si_NH_{2N+2}/SiNF_{2N+2}$, where N is greater than, or equal to, 1.

It is an aspect of the invention that Step 42 includes depositing the microcrystalline film in an ultra-high vacuum, whereby the minimization of contaminates enhances the formation of microcrystallites. In a preferred embodiment of the invention, the polycrystalline film is formed overlying a transparent substrate, and Step 42 includes depositing the microcrystalline film over the transparent substrate. The transparent substrate is selected from the group consisting of quartz, glass, and plastic. The polycrystalline film is suitable for the fabrication of thin film transistors for a liquid crystal display. In addition, Step 42 includes cleaning the transparent substrate before the microcrystalline film is deposited, where by the formation of microcrystallites in the microcrystalline film is promoted.

A specific example of a method for forming a polycrystalline film is presented below. The polycrystalline film of the present invention is also compared to results obtained from a conventional amorphous silicon process. Pertinent deposition conditions for the are listed in Table 1, below. Both film processes were formed under the following identical conditions:

1) sample size of 30;
2) use of an Excimer laser in ambient air;
3) a substrate temperature of 400° C.;
4) laser beam overlap of 95%;
5) a beam size of 65 mm×2 mm; and
6) a nominal energy density of 300 mJ/cm².

TABLE 1

| ATTRIBUTES | AMORPHOUS Si | μ-CRYSTALLITE Si |
|---|---|---|
| Power | 150 W | 600 W |
| Pressure | 1.3 Torr | 1.2 Torr |
| SiH₄ Flow | 250 sccm | 20 sccm |
| H₂ Flow | 1000 sccm | 2000 sccm |
| Temperature | 365° C. | 320° C. |
| Rate | 10.3 Å/s | 2.1 Å/s |
| Time | 50 sec | 238 sec |
| Thickness | 425 Å | 516 Å |
| Structure | amorphous Si | μ-crystallite Si |

After laser annealing, samples of both groups were investigated by Raman spectroscopy. As is well known in the art, Raman spectroscopy is a technique that provides information of bonds in a sample, that in turn, provides qualitative and quantitative information about crystal structure. The important responses to Raman spectroscopy are peak location and peak full width at half-maximum (FWHM).

Table 2 shows a the average of the Raman attributes of 30 samples per material group) analyzed by Raman spectroscopy. The phase of the starting material has been denoted as amorphous silicon for as-deposited amorphous silicon films, and as μc-Si for as-deposited microcrystalline silicon films. As indicated in Table 2, the average peak shift and peak FWHM, are significantly different between the two material groups, with the peak shift increasing and the FWHM decreasing when the as-formed film is deposited in the microcrystalline phase. These observations are consisted with a higher degree of crystallinity (i.e. lower defects density) and a larger grain size for the case of as-deposited microcrystalline silicon films.

TABLE 2

| RAMAN Attributes | Amorphous Si | μ-crystallite Si |
|---|---|---|
| Peak Shift | 517.73 (cm⁻¹) | 518.19 (cm⁻¹) |
| Peak FWHM | 4.90 (cm⁻¹) | 4.09 (cm⁻¹) |

Table 2 shows that the average peak shift and peak FWHM are significantly different between the two groups. The peak shift increases, and peak FWHM decreases with the with the use of the microcrystallite (μ-crystallite) film. These observations are consistent with a polycrystalline film having a higher degree of crystallinity, and larger grain size.

Transmission electron microscopy (TEM) was used to measure grain size The measurement of grain size was done using digitized versions of the TEM micrographs, through an image processing software package. Typically 200–300 grains were measured per sample. Using this approach, an equivalent grain size was calculated via equation (1), discussed above:

$$r = (a-b)^{1/2} \qquad (1)$$

where r is the equivalent grain size, a is the major axis of the grain, b is the minor axis of the grain.

Figure 8:
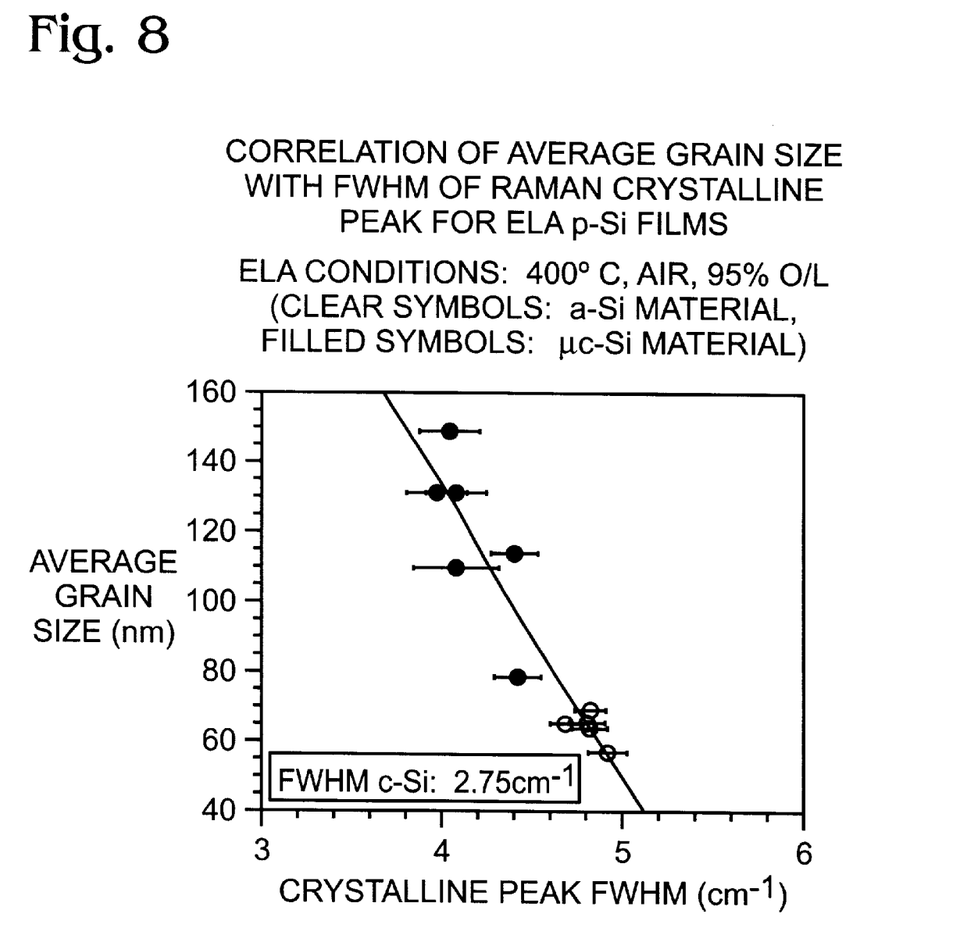
FIG. 8 illustrates the correlation between the average grain sizes of amorphous film and the microcrystalline film of the present invention.

FIG. 8 illustrates the correlation between the average grain sizes of amorphous film and the microcrystalline film of the present invention. The grains were measured by TEM, and the FW of the crystalline peak, measured by Raman spectroscopy. Based on the general trend of the data shown in FIG. 8, it can be concluded that the FWHM of the crystalline peak decreases as the average grain size of the polysilicon film increases. In previous studies it has been reported that a sharper crystalline peak was observed for films having higher crystalline quality. The structural quality of a polycrystalline film has at least two major components: (a) grain size, which determines density of grain boundaries and, thus, grain boundary defect density, and (b) intra-grain defect density. In the case of laser annealed polysilicon films, low intra-grain defect densities are typically obtained, therefore, changes in the FWHM are associated primarily with changes in the grain size of the polysilicon material.

FIG. 8 also illustrates the differences in means between amorphous film and microcrystallite film of the present invention. A one-to-one comparison, with respect to the grain size distributions, was performed between polysilicon films formed by ELA of a-Si or μc-Si films. This was a comparison aiming at identifying statistically significant differences between the two populations. For this purpose, samples which were annealed at an actual energy density of 300 mJ/cm² (same as set-point) were selected and compared.

The results of FIG. 8 favor a successful significance at the 1% level, indicating that the two populations have significantly different means; furthermore, as indicated, the polysilicon film that is formed by ELA of μc-Si demonstrates an almost twofold larger average grain size.

Figure 9:
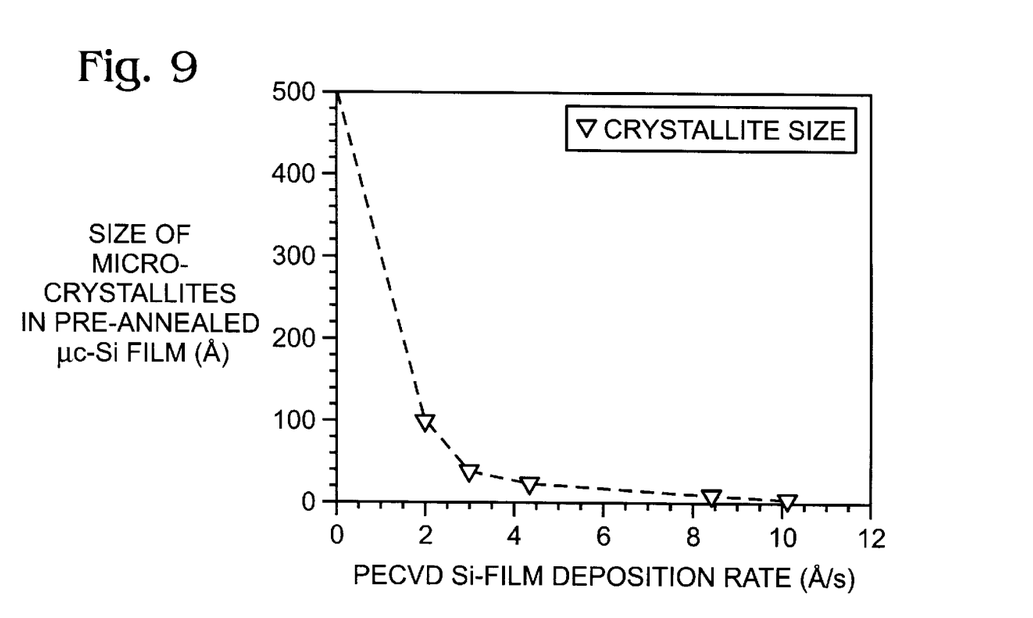
FIG. 9 is a graph showing the relationship between PECVD microcrystalline silicon film deposition rate and microcrystallite grain size, pre-anneal, in the method of the present invention.

In the preferred embodiment of the present invention in which step 42 (FIG. 7) is carried out by PECVD, deposition rate has been found to be a major factor in the size of the microcrystallites formed in the silicon film. FIG. 9 illustrates the relationship between microcrystallite size and deposition rate for silicon films deposited by PECVD. The size of the crystallites in a PECVD microcrystalline silicon film decreases as the deposition rate of the film increases. The dependency between crystallite size and deposition rate is highly non-linear, as illustrated in FIG. 9. To achieve crystallite size larger than 100 Å, deposition rates lower than about 2–3 Å per second are required. Below the deposition rate of 3 Å per second, small changes in rate can result in large changes in the crystalline size. Above 7 Å per second, the crystallite size is only marginally responsive to changes in deposition rate. Thus, one suitable range of operation is below 3 Å per second. Then, crystallites are obtained with an average size of 50 Å, or larger.

The present invention is intended for use in manufacturing of LCDs and, therefore, it is important to the efficiency of the process that deposition rates be as high as possible. Accordingly, while it is desirable to have microcrystallites with an average size of 50 Å or larger in the deposited silicon film, the present invention preferably encompasses deposition rates of up to 10 Å per second. Preferably the deposition rate is less than 7 Å per second, and ideally the deposition rate will be less than 3 Å per second.

Figure 10:
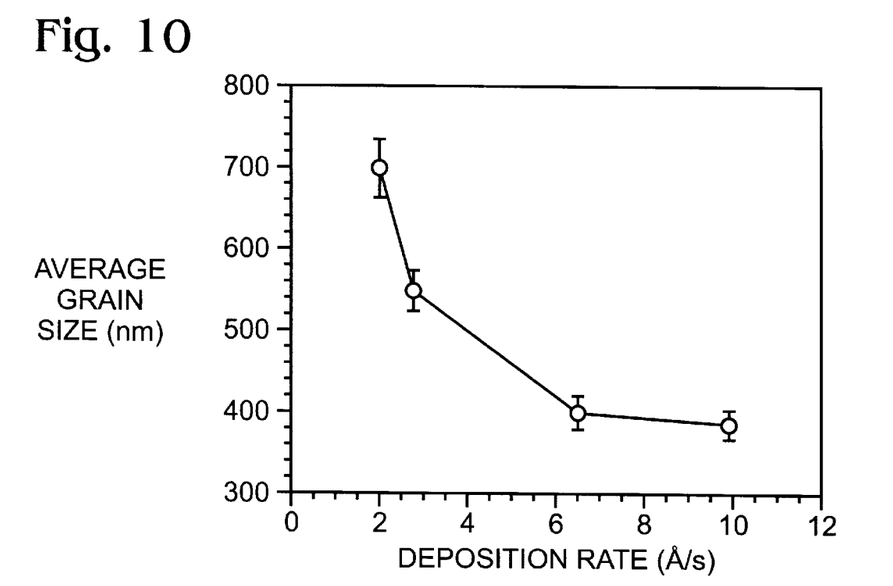
FIG. 10. is a graph showing the relationship between PECVD microcrystalline silicon film deposition rate and grain size, post-anneal, in the resultant polycrystalline silicon film in the method of the present invention.

The reason for the preference for deposition rates below 7 Å per second is best illustrated in FIG. 10, which is a graph showing the relationship between PECVD deposition rate and grain size, post-anneal. The data shown in FIG. 10 are based on step 43 (FIG. 7) being carried out by ELA on a deposited film approximately 500 Å thick at an energy density of approximately 275 mJ/cm$^2$. As can be seen from FIG. 10, there is a significant improvement in grain size in the polycrystalline silicon when the PECVD deposition rate (of the microcrystalline silicon film) is less than 7 Å per second.

Figure 11:
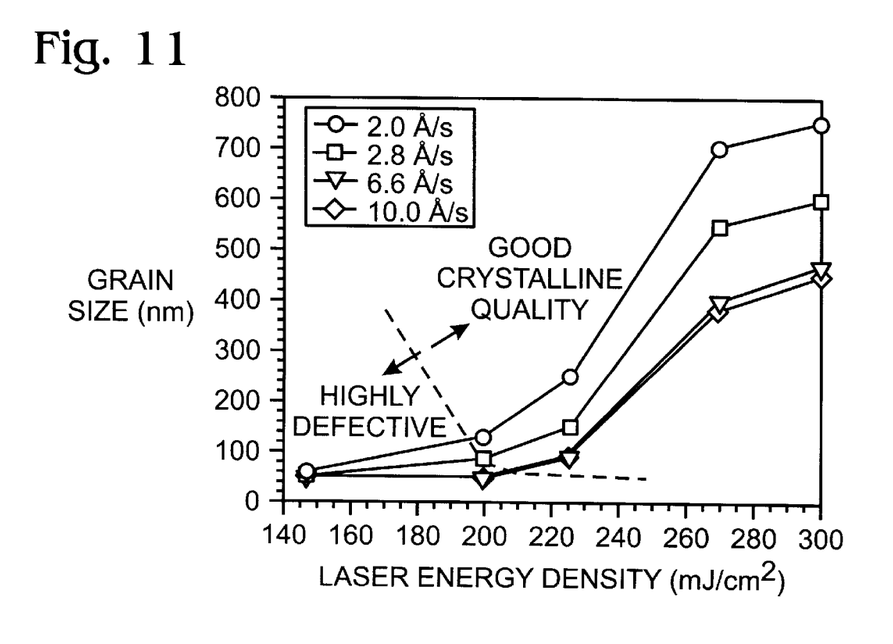
FIG. 11 is a graph showing the relationship between the ELA laser energy density supplied during the partial melt step and grain size, post-anneal, in the resultant polycrystalline silicon film in the method of the present invention, for selected PECVD deposition rates.

FIG. 11 is a graph showing the relationship between the ELA laser energy density supplied during the partial melt step and grain size, post-anneal, in the resultant polycrystalline silicon film for selected PECVD deposition rates. Based on the relationship between the microstructure pre- and post- anneal illustrated in FIGS. 9 and 10, it is a feature of the present invention that a correlation has been identified between as-deposited microstructure and post-ELA-process material characteristics (i.e. grain size). FIG. 11 summarizes the average grain size of polysilicon as a function of the laser energy density and the deposition rate used in step 42 (FIG. 7). Deposition rate also relates directly to the crystalline content (or crystalline fraction) of the pre-annealed film, as shown in FIG. 12, discussed below.

In FIG. 11, laser annealing is assumed to be performed in vacuum at a substrate temperature of 450° C. FIG. 11 shows a strong correlation between grain size and deposition rate. Specifically, two dependency regimes can be distinguished: at low energy density values (i.e., <240 mJ/cm$^2$) no significant dependency of the grain size upon the crystalline content is observed. The following explanation is relevant to the results of FIG. 11. The variability of the grain size to changes in the input laser energy is far superior for microcrystalline film, due to the controlled nucleation process inherent with the use of embedded seeds. Additional increases in grain size can be achieved by optimizing the pre-anneal crystalline content in the film, using lower deposition rates. Depending upon the microcrystalline content in the pre-annealed film and the selected energy density, the grain size of the post-annealed film can increase by at least a factor of 2–3 when compared to an amorphous silicon deposited layer.

One important prediction of this model relates to the optimum laser energy density as a function of the as-deposited microstructure. At the same energy density, microcrystalline material tends to develop a larger grain size than amorphous material. Alternatively, this can be thought of as analogous to a smaller laser energy requirement to achieve the same quality characteristic (for example, a grain size of about 340 nm requires 310 mJ/cm$^2$ when the film is deposited at 10 Å/s, but only 250 mJ/cm$^2$ if the film is deposited at 2 Å/s). Therefore, the optimum energy density level (maximizing the grain size) is smaller for microcrystalline films than for amorphous films. The result is important, since reduction of the operating laser energy density decreases substrate damage and equipment stress and use.

Figure 12:
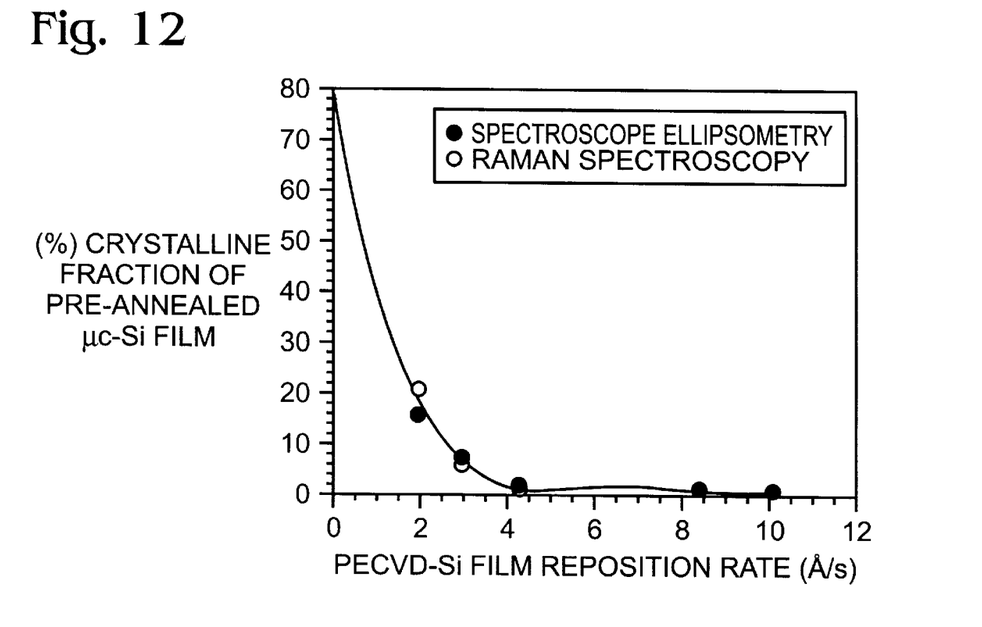
FIG. 12 is a graph showing the relationship between the PECVD deposition rate and the percentage of crystallinity (i.e., crystalline fraction) in the pre-annealed microycrystalline silicon film, using two measuring methods.

FIG. 12 is a graph showing the relationship between the PECVD deposition rate and the percentage of crystallinity (i.e., crystalline fraction) in the pre-annealed microcrystalline silicon film, using two measuring methods. Crystalline fraction is the percent of the overall deposited silicon which is crystallized. The deposition rate is critical to the pre-melt crystalline fraction. When the microcrystalline film deposition rate is less than 2 Å per second (Å/s), a crystalline fraction as high as 80% can be formed. Higher deposition rates can be used to form a crystalline fractions in the range between 0.01% and 50%. Preferably, the microcrystalline film is deposited with the PECVD method at a deposition rate of less than 10 Å/s and a deposition temperature of approximately 380 degrees C. In step 42 (FIG. 7) of the present invention, the deposition preferably seeks to achieve a crystalline fraction if the film as deposited which is generally in the range of 5% to 60%, and more preferably in the range 10% to 50%. The overall range usable with the present invention is 0.01% to 80%.

The present invention develops a relationship between the pre-melt crystallite conditions and the polycrystalline grain size and grain uniformity. For example, if the first microcrystallite size is large, greater than 300 Å, but the density is small, most microcrystallites will survive the melting phase of annealing. The crystallites will generally be sparsely placed and the grain size of the resulting polysilicon film will be large. However, if the microcrystallites are too widely spaced, the polycrystalline grain size becomes limited due to the phenomena of lateral growth. That is, small grains spontaneously nucleate between growing grains emanating from microcrystallite nucleation sites before they have a chance to coalesce. If the first crystallite grain size is small (less than 150 Å), then a large number of microcrystallites will be annihilated during the melting phase. A large density of smaller microcrystallites is required to provide enough seed crystals for post anneal crystallization.

Figure 13:
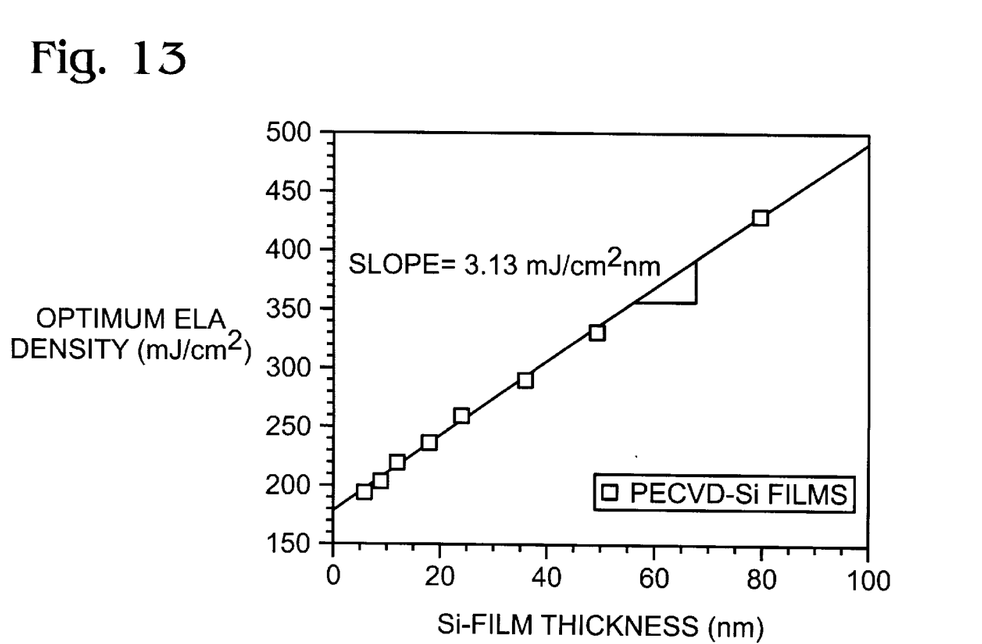
FIG. 13 is a graph showing the relationship between the thickness of the microycrystallite silicon film deposited on the substrate and the energy density used in ELA in a preferred embodiment of the present invention.

Yet another important factor in performing the method of the present invention is the energy density used in the ELA step. Energy needs to be supplied which is sufficient to melt a portion of the microcrystalline silicon film, but which leaves some of the microcrystallites unmelted. FIG. 13 is a graph showing the relationship between the thickness of the microycrystallite silicon film deposited on the substrate (i.e., the first thickness) and the energy density used in ELA. In general, it is assumed that the deposited silicon film (14 in FIG. 1) will have a thickness of 500 Å or less, although the invention is suitable for use with thicker silicon films. Accordingly, step 42 (FIG. 7) of the present invention includes depositing a microcrystalline silicon film of 1000 Å or less in thickness. In accordance with FIG. 13, the energy density for partially melting the deposited film will be generally in the range of 178–500 mJ/cm$^2$. The preferred energy density range is 220 to 320 mJ/cm$^2$. In accordance with FIG. 13, the step of annealing the silicon film by means of ELA in the present invention is preferably in accordance with the formula set for below as equation (2), wherein the energy density of E (in mJ/cm$^2$) supplied by ELA to carry out step 43 (FIG. 7) is determined, relative to the first thickness T (in Å) of the deposited microcrystalline silicon film:

$$E = 178 + 3.13 \times T \tag{2}$$

The interrelationships between energy density supplied in step 42 and deposition rate when PECVD is used, show an increasing benefit in larger grain size in the polycrystalline silicon if the size and content of deposited microcrystallites are sufficient to encourage crystal growth from seeds, post-anneal. At mid-to-high energy density values, a strong correlation between grain size and crystalline content is observed, with the average grain size becoming increasingly larger as the crystalline content increases (i.e., when the film is deposited at a lower deposition rate).

The present invention offers benefits which could lead to a new generation of high performance TFTs. Polycrystalline films made per the present invention have larger crystal grains than films made by prior art methods. Large uniform grains permit the transistors to have both excellent switching characteristics, high electron mobility, and consistent behavior across the entire film. The improved switching characteristics of transistors fabricated from the polycrystalline film allow driver circuitry, previously positioned around the periphery of the transparent substrate, to be located directly on the substrate. In this manner, the size, and complexity of LCDs are being reduced. Other embodiments of the invention will occur to those skilled in the art.

What is claimed is:

1. A method of optimizing crystal grain size in polycrystalline silicon films formed by crystallization of as-deposited silicon, comprising the steps of:

depositing a microcrystalline silicon film on a substrate;

partially melting the silicon film to leave unmelted a portion of the microcrystallites in the film; and allowing the silicon film to crystallize by crystal growth from the unmelted microcrystallites in the silicon, whereby a film of polycrystalline silicon having optimal average grain size is formed on the substrate.

2. A method as in claim 1 in which the step of partially melting the silicon film includes annealing the film by means of laser anneal.

3. A method as in claim 1 in which the step of partially melting the silicon film includes annealing the film by means of lamp anneal.

4. A method of optimizing crystal grain size in polycrystalline silicon films formed by excimer laser anneal (ELA) crystallization of as-deposited silicon, comprising the steps of:

depositing a microcrystalline silicon film on a substrate;

by means of ELA, annealing the silicon film, the energy density of the ELA being selected to melt a portion of the silicon film and to leave unmelted some microcrystallites in the film; and allowing the silicon film to crystallize by crystal growth from the unmelted microcrystallites in the silicon, whereby a film of polycrystalline silicon having optimal average grain size is formed on the substrate.

5. A method as in claim 4 in which the step of depositing a microcrystalline silicon film includes depositing a silicon film which includes microcrystallites with an average size generally in the range of 5 Å to 500 Å.

6. A method as in claim 4 including a further step, following the step of depositing a microcrystalline silicon film on a substrate, of depositing a second, completely amorphous-matter film overlying the microcrystalline film deposited in the step of depositing a microcrystalline silicon film on a substrate, and in which the annealing in the step of annealing the silicon film includes extending crystalline regions from the microcrystalline film into the second film, whereby the film deposition process is speeded with the use of a completely amorphous film.

7. A method as in claim 4 in which the step of depositing a microcrystalline silicon film includes depositing a silicon film in which the crystalline fraction in the film as deposited is generally in the range of 0.01% to 80%.

8. A method as in claim 7 in which the step of depositing a microcrystalline silicon film includes depositing a silicon film in which the crystalline fraction in the film as deposited is generally in the range of 5% to 65%.

9. A method as in claim 8 in which the step of depositing a microcrystalline silicon film includes depositing a silicon film in which the crystalline fraction in the film as deposited is generally in the range of 10% to 50%.

10. A method as in claim 4 in which the step of depositing a microcrystalline silicon film includes depositing the silicon film by plasma enhanced chemical vapor deposition (PECVD) at a deposition rate of less than 10 Å per second.

11. A method as in claim 10 in which the step of depositing a microcrystalline silicon film includes depositing the silicon film by plasma enhanced chemical vapor deposition (PECVD) at a deposition rate of less than 7 Å per second.

12. A method as in claim 11 in which the step of depositing a microcrystalline silicon film includes depositing the silicon film by plasma enhanced chemical vapor deposition (PECVD) at a deposition rate of less than 3 Å per second.

13. A method as in claim 4 in which the step of depositing microcrystalline silicon film includes depositing microcrystalline silicon on a substrate to a thickness of generally 1000 Å or less, and the step of annealing the silicon film by means of ELA includes directing excimer laser energy at the silicon film at an energy density generally in the range of 190 mJ/cm$^2$ to 500 mJ/cm$^2$.

14. A method as in claim 4 in which the step of depositing microcrystalline silicon film includes depositing microcrystalline silicon on a substrate to a first thickness, and the step of annealing the silicon film by means of ELA includes directing excimer laser energy at the silicon film at an energy density of about E, wherein E (in mJ/cm$^2$) is determined, relative to said first thickness T (in Å) of the deposited microcrystalline silicon film, by the formula:

$$E=178+3.13\times T.$$

15. A method of optimizing crystal grain size in polycrystalline silicon films formed by excimer laser anneal (ELA) crystallization of as-deposited silicon, comprising the steps of:

positioning a substrate in a plasma enhanced chemical vapor deposition (PECVD) chamber;

depositing a silicon film on the substrate by means of PECVD, said depositing step including introducing a flow a reacting gases into the PECVD chamber at a rate selected to produce microcrystallites in the deposited silicon film; and by means of ELA, crystallizing the silicon film by directing excimer laser energy at the silicon film to form polycrystalline silicon, the energy density of the ELA being selected to melt a portion of the silicon film and leave unmelted some microcrystallites in the film, such that crystal growth occurs from the existing microcrystallites in the silicon, whereby a film of polycrystalline silicon having optimal average grain size is formed on the substrate.

16. A method as in claim 15 in which the step of depositing a microcrystalline silicon film includes depositing a silicon film in which the crystalline fraction in the film as deposited is generally in the range of 10% to 50%.

17. A method as in claim 15 in which the step of depositing a microcrystalline silicon film includes depositing the silicon film by plasma enhanced chemical vapor deposition (PECVD) at a deposition rate of less than 10 Å per second.

18. A method as in claim 17 in which the step of depositing a microcrystalline silicon film includes depositing the silicon film by plasma enhanced chemical vapor deposition (PECVD) at a deposition rate of less than 7 Å per second.

19. A method as in claim 18 in which the step of depositing a microcrystalline silicon film includes depositing the silicon film by plasma enhanced chemical vapor deposition (PECVD) at a deposition rate of less than 3 Å per second.

20. A method as in claim 15 in which the step of depositing microcrystalline silicon film includes depositing microcrystalline silicon on a substrate to a thickness of generally 1000 Å or less, and the step of annealing the silicon film by means of ELA includes directing excimer laser energy at the silicon film at an energy density generally in the range of 190 mJ/cm$^2$ to 500 mJ/cm$^2$.

* * * * *